United States Patent
Maeda et al.

[11] Patent Number: 6,157,022
[45] Date of Patent: Dec. 5, 2000

[54] BIAS VOLTAGE CONTROL CIRCUITRY FOR AVALANCHE PHOTODIODE TAKING ACCOUNT OF TEMPERATURE SLOPE OF BREAKDOWN VOLTAGE OF THE DIODE, AND METHOD OF ADJUSTING THE SAME

[75] Inventors: Masaaki Maeda, Tokyo; Makoto Sudo, Nagoya, both of Japan

[73] Assignee: Oki Electric Industry Co., Ltd., Tokyo, Japan

[21] Appl. No.: 09/188,213

[22] Filed: Nov. 9, 1998

[30] Foreign Application Priority Data

Jan. 12, 1998 [JP] Japan .................................. 10-014728

[51] Int. Cl.[7] ..................................................... H01J 40/14
[52] U.S. Cl. .............................. 250/214 R; 250/214 AG; 327/514
[58] Field of Search ........................ 250/214 A, 214 AG, 250/214 R, 214 C, 214.1; 327/514, 535; 361/93.8

[56] References Cited

U.S. PATENT DOCUMENTS

| | | | |
|---|---|---|---|
| 4,479,052 | 10/1984 | Suzuki | 250/214 R |
| 5,548,112 | 8/1996 | Nakase et al. | 327/514 |
| 5,696,657 | 12/1997 | Nourrcier, Jr. et al. | 361/93 |
| 5,917,636 | 6/1999 | Ushirozawa | 250/214 AG |

Primary Examiner—Stephone B. Allen
Attorney, Agent, or Firm—Jones Volentine, LLC

[57] ABSTRACT

Circuitry capable of controlling a bias voltage for an avalanche photodiode (APD) in accordance with the temperature slope of the breakdown voltage of the APD is disclosed. A reference voltage generating circuit sets a voltage implementing an optimal amplification ratio on an output terminal, and generates a reference voltage by taking account of the temperature slope of the breakdown voltage of the APD. The reference voltage is applied to one input of a voltage comparator. A setting circuit feeds to an adding circuit a preselected voltage for controlling the voltage on the output terminal to a value capable of implementing the optimal multiplication ratio. A temperature compensating circuit feeds to the adding circuit a voltage corresponding to the temperature slope of the above breakdown voltage. The temperature slope is representative of the variation of the breakdown voltage with respect to temperature. The adding circuit adds the two input voltages and delivers its output to the voltage comparator as the reference voltage. The voltage comparator produces a difference between the reference voltage and a voltage input from the output terminal and outputs a voltage control signal representative of the difference.

15 Claims, 10 Drawing Sheets

BIAS VOLTAGE CONTROL CIRCUITRY FOR AVALANCHE PHOTODIODE TAKING ACCOUNT OF TEMPERATURE SLOPE OF BREAKDOWN VOLTAGE OF THE DIODE, AND METHOD OF ADJUSTING THE SAME

BACKGROUND OF THE INVENTION

1. Field of the Invention

The present invention relates to circuitry for controlling a bias voltage for an avalanche photodiode (APD), and a method of adjusting the same. More particularly, the present invention is concerned with optimal control over a bias voltage to be applied to an APD.

2. Description of the Background Art

It is a common practice with an optical communication system to use a photoelectric transducer including an APD which is a specific form of a photosensitive device. The APD is capable of amplifying a signal beam current and essential with an optical fiber communication system dealing with weak optical signals.

The amplification of a signal beam current effected by the APD is usually represented by a multiplication ratio M. To cause the APD to operate efficiently, a DC bias voltage of more than several ten volts should be applied to the APD. The multiplication ratio M and the DC bias voltage are closely related to each other. Two different systems are available for applying a DC bias voltage, i.e., a constant multiplication ratio system and a variable multiplication ratio system. The constant multiplication ratio system uses, e.g., a Zener diode and maintains the multiplication ratio M constant by stabilizing the DC bias voltage. The variable multiplication ratio system maintains the DC bias voltage optimal by executing a broad range of automatic gain control (AGC).

The problem with the variable multiplication ratio system is that the multiplication ratio of the APD is susceptible to the temperature variation of an AGC amplifier and the fluctuation of a power source, resulting in a low signal-to-noise (SIN) ratio. The variable multiplication ratio system and constant multiplication ratio system both have a drawback that some means is necessary for controlling a high voltage generating circuit, e.g., a DC/DC converter or a Cockcroft circuit used to boost an oscillator output signal. Such a high voltage generating circuit must be included in a control loop, scaling up the entire circuitry.

Further, as shown in FIG. 2, the multiplication ratio of the APD increases almost infinitely at breakdown voltages of opposite direction. It is therefore necessary to confine the bias voltage in a range below the breakdown voltage. Moreover, as shown in FIG. 3, the breakdown voltage changes with a change in the ambient temperature. Therefore, it is extremely important from the SIN ratio standpoint to effect temperature compensation and to implement an optimal multiplication ratio at a voltage below the breakdown voltage.

SUMMARY OF THE INVENTION

It is therefore an object of the present invention to provide APD bias voltage control circuitry capable of freeing a bias voltage for an APD from the influence of the variation of ambient temperature and that of a power source voltage, controlling the bias voltage to an optimal multiplication ratio for the APD, and reducing circuit scale, and a method of adjusting the same.

In accordance with the present invention, bias voltage control circuitry for an APD includes a voltage varying circuit for controlling an input DC voltage in accordance with a voltage control signal to thereby output a varied voltage. The varied voltage is controlled and then output via the output terminal of the circuitry as a bias voltage to be applied to the APD. A temperature slope voltage outputting circuit outputs a voltage corresponding to the temperature slope of the breakdown voltage of opposite direction particular to the APD. A set voltage outputting circuit outputs a set voltage for controlling the voltage of the output terminal to a preselected value. A comparing and control circuit sets a reference voltage based on the voltage corresponding to the temperature slope and the set voltage, generates the voltage control signal such that the reference voltage and a voltage input from the output terminal via a resistor coincide with each other, and feeds the voltage control signal to the voltage varying circuit. The voltage varying circuit includes a digital variable resistor whose resistance is variable in accordance with a digital voltage control signal. The digital variable resistor outputs the digital voltage control signal by digitizing the voltage control signal and feeding the digital voltage control signal to the digital variable resistor. As a result, the resistance of the digital variable resistor is set to control the input DC voltage.

Also, in accordance with the present invention, a method of executing adjustment of temperature compensation and adjustment to an optimal multiplication ratio for the above bias voltage control circuitry begins with a step of measuring the temperature slope of the breakdown voltage of the opposite direction and an optimal multiplication ratio particular to the APD to be used. After the APD has been connected to the output terminal, a preselected DC voltage is applied to the input terminal. Pulling of the current into the current pulling circuit is interrupted, and then the output voltage setting circuit is caused to control the voltage on the output terminal to a preselected value. Subsequently, the pulling of the current into the current pulling circuit is resumed to pull in a current corresponding to the temperature slope. Finally, the output voltage setting circuit is caused to adjust the voltage on the output terminal to the optimal multiplication ratio.

BRIEF DESCRIPTION OF THE DRAWINGS

The objects and features of the present invention will become more apparent from the consideration of the following detailed description taken in conjunction with the accompanying drawings in which.

In the drawings, identical reference numerals denote like structural elements.

DESCRIPTION OF THE PREFERRED EMBODIMENTS

Figure 1:
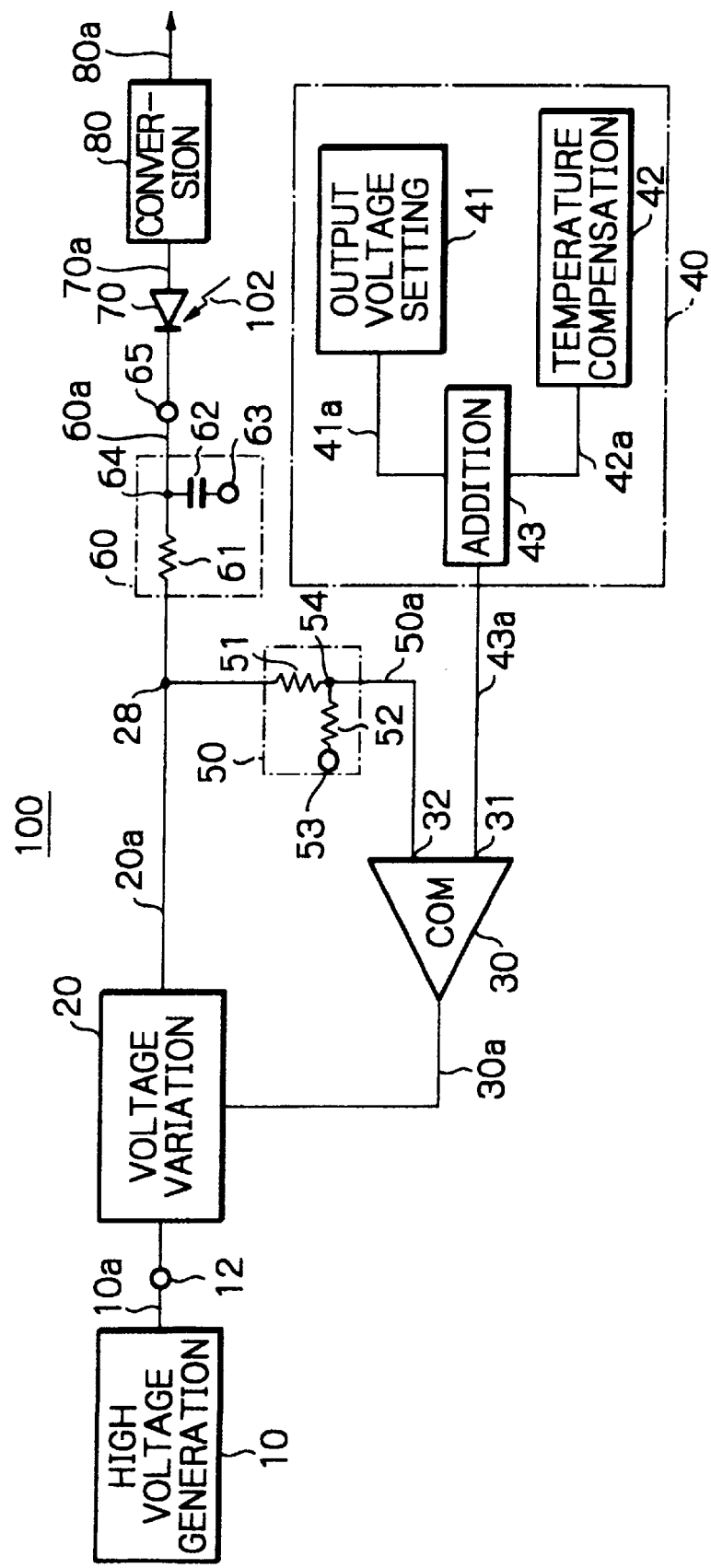
FIG. 1 is a block diagram schematically showing a bias voltage control circuitry for an APD embodying the present invention.
Figure 2:
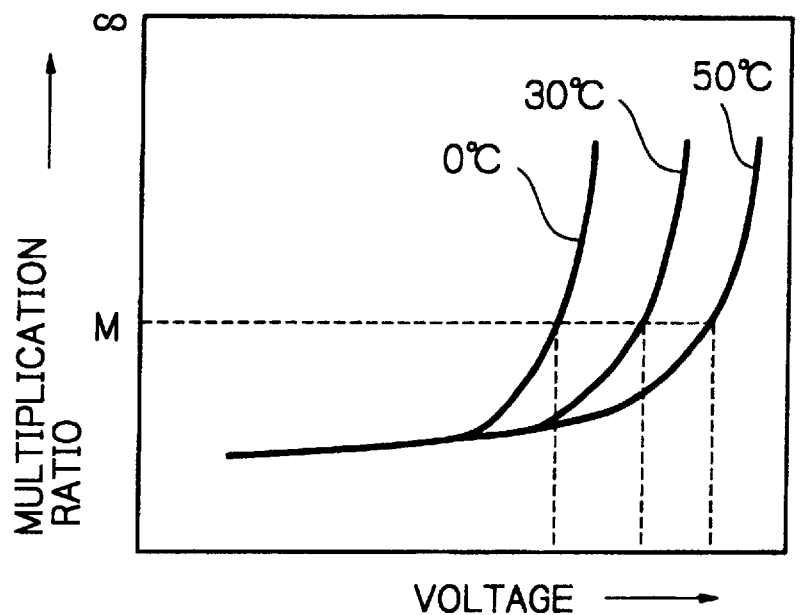
FIG. 2 is a graph showing a general relation between the bias voltage and the multiplication ratio of an APD together with the variation of the multiplication ratio with respect to temperature.

Referring to FIG. 1 of the drawings, a first bias voltage control circuitry for an APD embodying the present invention is shown and generally designated by the reference numeral 100. As shown, the bias the voltage control circuitry 100 includes an input terminal 12 for receiving a high DC voltage, e.g., several ten volts 10a output from a high voltage generation 10. The high voltage 10a is used to bias an APD 70, as will be described specifically later. A voltage variation 20 varies the DC voltage appearing on the input terminal 12 to a DC voltage 20a in accordance with a voltage control signal 30a output from a voltage comparator (COM) 30, and applies the DC voltage 20a to a terminal 28.

Figure 3:
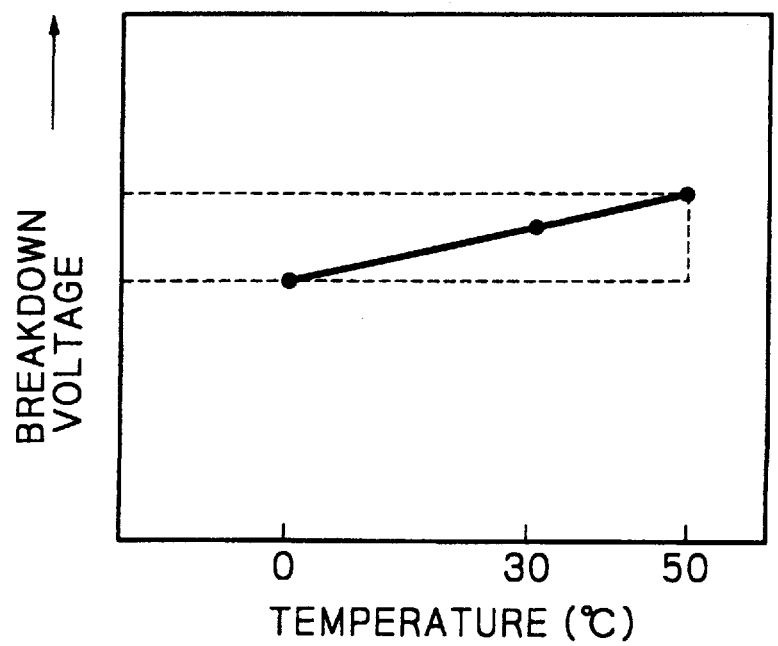
FIG. 3 is a graph showing the general variation of the breakdown voltage of an APD with respect to temperature.

A reference voltage generating circuit 40 generates a reference voltage 43a by taking account of a voltage to be set on the terminal 28 for implementing an optimal multiplication ratio and by taking account of the temperature slope of the breakdown voltage of the APD 70. The reference voltage 43a is fed to one input 31 of the COM 30. Specifically, the reference voltage generating circuit 40 includes an output voltage setting 41 for setting a preselected voltage 41a implementing the optimal multiplication ratio of the APD 70 on the terminal 28. The voltage 41a is input to an addition 43. A temperature compensation 42 outputs a voltage 42a representative of the temperature slope A (V/°C.) of the breakdown voltage of the APD 70 and inputs the voltage 42a to the addition 43. As shown in FIG. 3, the temperature slope is indicative of how much the breakdown voltage of the APD 70 varies for a temperature variation. The addition 43 adds the preselected voltage 41a and voltage 42a and delivers the resulting sum or reference voltage 43a to the input 31 of the COM 30.

The control circuit 100 further includes an attenuator 50 made up of a resistor 51 serially connected to the terminal 28 and a resistor 52 serially connected to the resistor 51. The other end of the resistor 52 is connected to a minimum potential terminal 53. A divided voltage 50a appearing on a junction 50a between the resistors 51 and 52 is fed to the other input 32 of the COM 30. The COM 30 produces a difference between the voltage 50a and the reference voltage 43a and delivers the difference to the control input of the voltage variation 20 as the previously mentioned voltage control signal 30a.

The terminal 28 is connected to a low pass filter (LPF) circuit 60 made up of a resistor 61 connected to the terminal 28 and a capacitor 62 connected to the resistor 61. The other end of the capacitor 62 is connected to a minimum potential terminal 63. A voltage appearing on a junction 64 between the resistor 61 and the capacitor 62 is applied to a terminal 65 as a bias voltage 60a. That is, the LPF circuit 60 filters out noise signals lying in a high frequency range while passing low frequency components therethrough.

The APD 70 is connected to the terminal 65 and biased by the bias voltage 60a. When an optical signal 102 is applied to the APD 70, the APD 70 outputs an operation current 70a and feeds it to a current/voltage conversion and amplification 80. The current/voltage conversion and amplification 80 converts the operation current 70a of the APD 70 to a voltage while amplifying it, and outputs a detected voltage signal 80a.

In operation, the high voltage 10a output from the high voltage generation 10 is applied to the voltage variation 20 via the input terminal 12 of the circuitry 100. In the reference voltage generating circuit 40, the output voltage setting 41 outputs the voltage 41a for setting the preselected voltage on the terminal 28 and feeds the voltage 41a to the addition 43. Also, the temperature compensation 42 feeds to the addition 43 the voltage 42a representative of the temperature slope of the breakdown voltage of the APD 70. The addition 43 adds the two input voltages 41a and 52a and delivers the resulting reference voltage 43a to the input 31 of the COM 30.

The attenuator 50 attenuates the voltage appearing on the terminal 28 and feeds the attenuated voltage 50a to the other input 32 of the COM 30. The COM 30 compares the attenuated voltage 50a with the reference voltage 43a and delivers the voltage control signal 30a representative of a difference between them to the voltage variation 20. In response, the voltage variation 20 outputs a DC voltage 20a corresponding to the voltage control signal 30a and applies it to the terminal 28. The LPF circuit 60 receives the DC voltage 20a via the terminal 20 and filters out noise contained in the voltage 20a. The resulting noise-free bias voltage 60a is fed from the LPF circuit 60 to the APD 70 via the terminal 65.

At the same time, the voltage on the terminal 28 is attenuated by the attenuator 50 and then applied to the input 32 of the COM 30 as the voltage 50a. The COM 30 again compares the voltage 50a with the reference voltage 43a input to the other input thereof, producing the voltage control signal 30a representative of a difference between the voltages 50a and 43a. Such a voltage control procedure is repeated until the voltage 50a coincides with the reference voltage 43a. Once the voltage 50a coincides with the reference voltage 43a, the voltage control signal 30a appearing at that time is continuously applied to the voltage variation 20. As a result, the voltage to be output from the terminal 28 is so controlled as to implement the optimal multiplication ratio while being corrected against temperature variation.

The above construction and operation obviate the occurrence that the multiplication ratio of the APD 70 varies and degrades the S/N ratio due to the temperature variation of an AGC amplifier and the fluctuation of a power source voltage. This is the problem particular to the variable multiplication ratio system, as discussed earlier. Further, the illustrative embodiment does not have to control, e.g., a DC/DC converter or a Cockcroft circuit for boosting an oscillator output and customarily included in the constant multiplication ratio system. It is therefore possible to provide the high voltage generation 10 independently of the control loop so as to scale down the circuitry. For example, the high voltage generation 10 may be implemented even by a simple DC/DC converter featuring a relatively small circuit scale and needing a minimum of mounting area. In addition, a DC power source voltage of several ten volts adapted for an exchange may be directly applied to the bias voltage control circuitry 100, in which case the high voltage generation 10 will be omitted.

Figure 4:
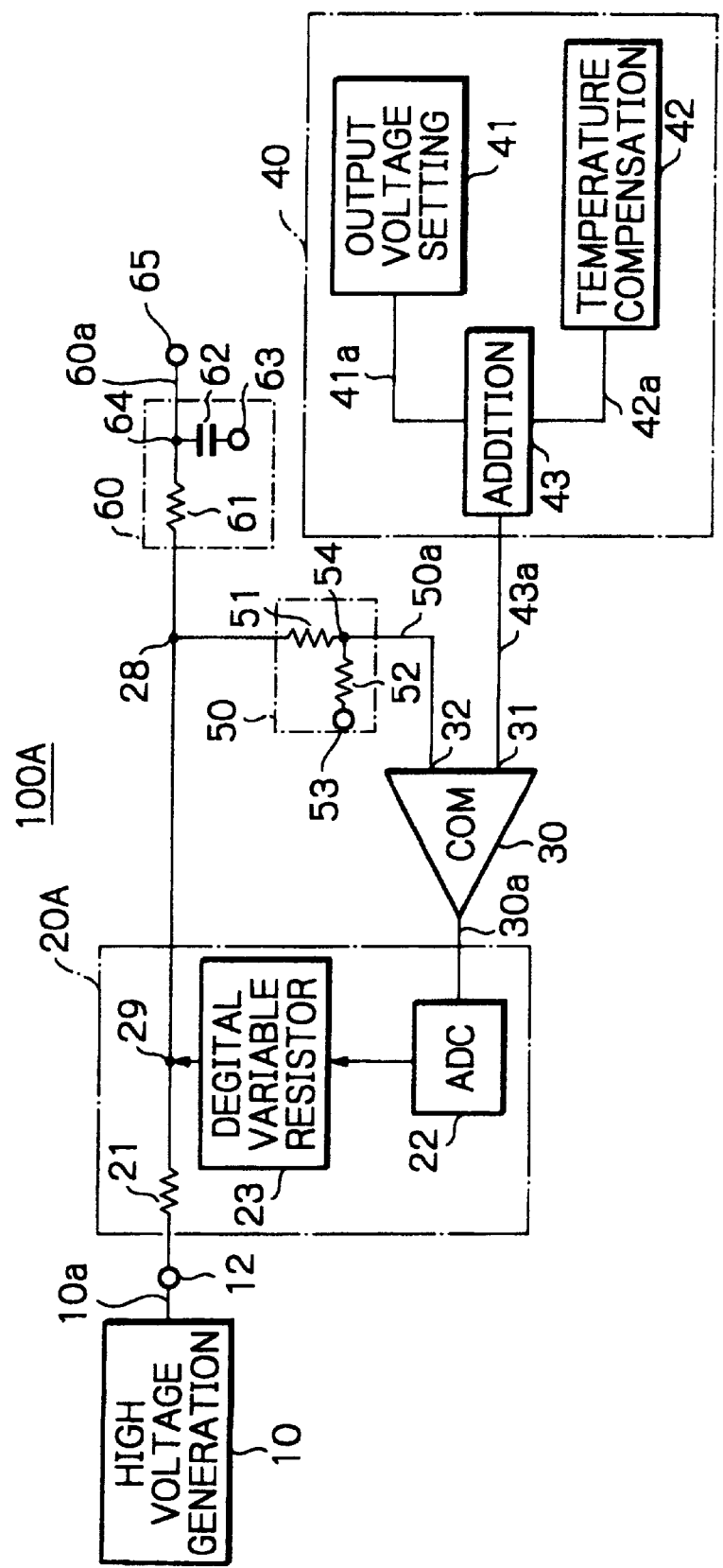
FIG. 4 is a block diagram schematically showing an alternative embodiment of the present invention.

FIG. 4 shows an alternative embodiment of the present invention. As shown, bias voltage control circuitry, generally 100A, includes a voltage varying circuit or voltage variation 20A made up of a resistor 21, an analog-to-digital converter (ADC) 22, and a digital variable resistor 23. The ADC 22 covers the voltage control signal 30a received from the COM 30 to a digital voltage control signal 22a and feeds the signal 22a to the digital variable resistor 23.

The digital variable resistor 23 sets a resistance matching with the above voltage control signal 22a therein. The resistor 21 attenuates the DC voltage 10a input from the high voltage generation 10 on the basis of a ratio between the resistance of the resistor 21 and the resistance set by the variable resistor 23, and delivers the attenuated voltage to a terminal 29 connected to the terminal 28. The digital variable resistor 23 is available on the market in the form of an IC (Integrated Circuit) package. The digital variable resistor 23 is capable of digitally varying its resistance stepwise and therefore accurately in accordance with the digital voltage control signal 22a. It follows that the divided voltage appearing on the terminal 29 can also be accurately varied in accordance with the voltage control signal 22a. It is to be noted that the resistor 21 is omissible if the output impedance of the high voltage generation 10 is high.

The operation of the circuitry 100A of FIG. 4 will be described hereinafter. The high voltage output from the high voltage generation 10 is input to the voltage variation 20A via the input terminal 12 and applied to the resistor 21. When the output voltage setting 41 outputs the voltage 41a for setting a preselected voltage on the terminal 28, the voltage 41a is fed to the addition 43. The voltage 42a output from the temperature compensation 42 and corresponding to the temperature slope of the breakdown voltage of the APD 70 is also fed to the addition 43.

The addition 43 adds the two input voltages 41a and 42a and delivers the resulting reference voltage 43a to one input 31 of the COM 30. The voltage 50a appearing on the terminal 28 and attenuated by the attenuator 50 is applied to the other input 32 of the COM 30. The COM 30 compares the voltage 50a with the reference voltage 43a and feeds the voltage control signal 30a representative of a difference between the voltages 50a and 43a to the voltage variation 20A. In the voltage variation 20A, the ADC 22 converts the voltage control signal 30a to the digital voltage control signal 22a. The digital variable resistor 23 sets a resistance matching with the digital voltage control signal 22a. Consequently, a divided output voltage based on the resistance of the variable resistor 23 and the resistance of the resistor 21 appears on the terminal 29 and is applied to the terminal 28 in the form of a DC voltage. This DC voltage is routed through the LPF 60 and terminal 65 to the APD 70, not shown, as the noise-free bias voltage 60a.

At the same time, the DC voltage on the terminal 28 is attenuated by the attenuator 50 and then applied to the input 32 of the COM 30 as the voltage 50a. The COM 30 produces a difference between the voltage 50a and the reference voltage 43a applied to the input 31 and outputs the voltage control signal 30a representative of the difference. The voltage control signal 31a is fed to the voltage variation 20A, as stated earlier. Such voltage control is repeated until the voltage 50a coincides with the reference voltage 43a. When and after the voltage 50a has coincided with the reference voltage 43a, the voltage control signal 30a appearing at that time is continuously applied to the voltage variation 20A. In this manner, the voltage output via the terminal 28 is so controlled as to implement the optimal multiplication ratio while being subjected to temperature compensation.

With the above voltage variation 20A, it is possible to vary the resistance of the digital variable resistor 23 faithfully in accordance with the voltage control signal 30a, and therefore to vary the voltage on the terminals 29 and 28 with accuracy. This allows the entire circuitry 100A to accurately control the bias voltage for the APD 70, not shown, in such a manner as to implement the optimal multiplication ratio. In addition, the circuitry 100A is feasible for integration and allows the number of parts, as well as the mounting area, to be reduced.

Figure 5:
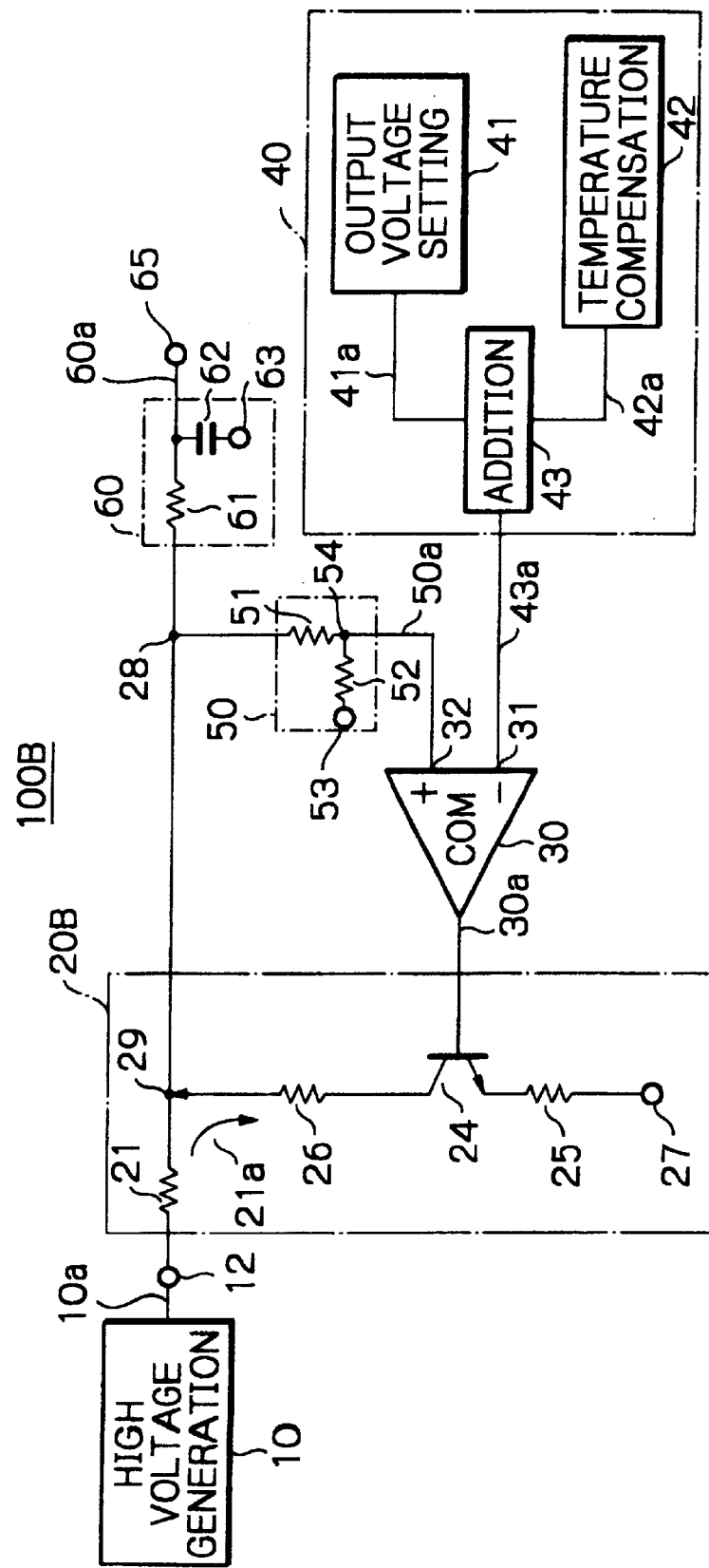
FIG. 5 is a block diagram schematically showing another alternative embodiment of the present invention.

Reference will be made to FIG. 5 for describing another alternative embodiment of the present invention. As shown, bias control circuitry, generally 100B, includes a voltage varying circuit or voltage variation 20B including a transistor 24. The transistor 24 is used to control a current for thereby varying the output voltage of the voltage variation 20B. Specifically, the input terminal 12 to which the output DC voltage of the high voltage generation 10 is applied is serially connected to one end of the resistor 21. The other end of the resistor 21 is connected to the terminal 29 which is, in turn, connected to the terminal 28. A resistor 26 is serially connected to the terminal 29 at one end and connected to the collector of the transistor 24 at the other end. The voltage control signal 30a output from the COM 30 is input to the base of the transistor 24. A resistor 25 is connected to the emitter of the transistor 24 at one end and connected to a minimum voltage terminal 27 at the other end.

In operation, when the voltage control signal 30a is applied to the base of the transistor 24, a bias current 21a flowing through the resistors 21, 26 and 25 is controlled in accordance with the size of the signal 30a. As a result, the voltage appearing on the terminal 29 between the resistors 21 and 26 is varied in accordance with the size of the voltage control signal 30a. Specifically, when the voltage of the voltage control signal 30a increases, the bias current 21a and therefore the voltage drop of the resistor 21 increases. Consequently, the voltage on the terminal 29 is lowered Conversely, when the voltage of the voltage control signal 30a decreases, the bias current 21a and therefore the voltage drop of the resistor 21 decreases, raising the voltage on the terminal 29. In this manner, the voltage on the terminal 29 is variable in accordance with the voltage on the terminal 28.

As stated above, the transistor 24 controls the bypass current 21a in accordance with the voltage control signal 30a. As a result, the voltage applied to one input 32 of the COM 30 is caused to coincide with the reference voltage 43a applied to the other input 31 of the COM 30. The bias voltage on the terminal 28 can therefore be accurately controlled to implement the optimal multiplication ratio even when temperature and/or power source voltage fluctuates. In addition, the voltage variation 20B needs a minimum number of parts, i.e., the resistors 21, 25 and 26 and transistor 24 and is therefore feasible for integration. This further reduces the amounting area to be allocated to the circuitry 100B.

Figure 6:
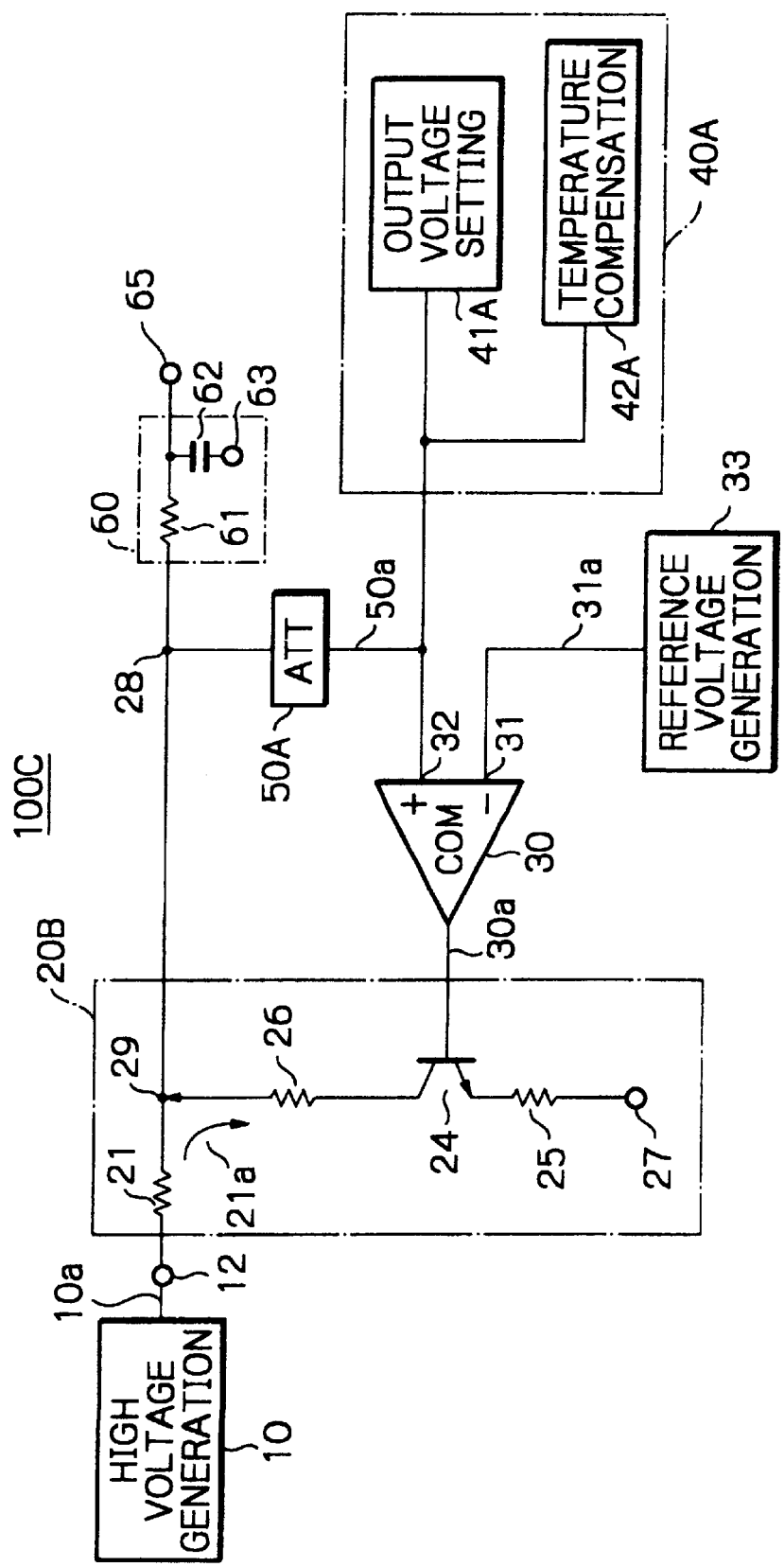
FIG. 6 is a block diagram schematically showing still another alternative embodiment of the present invention.

Referring to FIG. 6, still another alternative embodiment of the present invention will be described. As shown, bias voltage control circuitry, generally 100C, also includes the voltage varying circuit or voltage variation 20B shown in FIG. 6. A reference voltage generation 33 feeds a reference voltage 31a to one input 31 of the COM 30. The reference voltage 3 la corresponds to, e.g., the medium potential of a power source voltage range assigned to the COM 30. An attenuator (ATT) 50A is serially connected to the terminal 28 at one end thereof. A voltage 50a attenuated by the ATT 50A is applied to the other input 32 of the COM 32. Further, a current bypass circuit 40A is connected to the ATT 50A.

The current bypass circuit 40A pulls in a current from the ATT 50A such that a voltage implementing the optimal multiplication ratio is set up. In addition, the current bypass circuit 40A pulls in a current corresponding to the temperature slope of the breakdown voltage of the APD 70 not shown. Specifically, the current bypass circuit 40A is made up of an output voltage setting 41A and a temperature compensation 42A. The output voltage setting 41A pulls in a current for setting a voltage capable of implementing the optimal multiplication ratio the APD 70, and sets a voltage for the terminal 28 on the basis of a voltage division ratio between the resistance of the resistor 21 and the resistance of the ATT 50A. The temperature compensation 42A pulls in a current corresponding to the temperature slope of the breakdown voltage of the APD 70 from the ATT 50A, and adjusts the voltage on the input 32 of the COM 30.

The circuitry 100C of FIG. 6 is operated as follows. The DC voltage output from the high voltage generation 10 is input to the resistor 21 of the voltage variation 20B while the reference voltage 31a output from the reference voltage generation 33 is input to one input 31 of the COM 30. The output voltage setting 41A pulls in a current corresponding to a voltage for implementing the optimal multiplication ratio for the APD 70. Further, a current corresponding to the temperature slope of the breakdown voltage of the APD 70 is bypassed from the input 32 of the COM 30 to the current bypass circuit 40A.

The COM 30 compares the voltage 50a attenuated by the ATT 50A with the reference voltage 31a and continuously produces the voltage control signal 30a until the former coincides with the latter. The voltage control signal 30a variably controls the voltage appearing on the terminal 28, i.e., the bypass current 21a flowing through the transistor 24. Consequently, the voltage on the terminal 28 is stabilized by a voltage drop determined by the product of the current bypassed by the transistor 24 and the resistance of the resistor 21.

The current bypass circuit 40A bypasses, from the input 32 of the COM 30, the current corresponding to the voltage for implementing the optimal multiplication ratio for the APD 70 and the current corresponding to the temperature slope of the breakdown voltage of the APD 70. However, the voltage control signal 30a output from the COM 30 constantly equalize the voltages applied to the inputs 31 and 32 of the COM. Consequently, the current bypass circuit 40A raises the voltage on the terminal 28 by an amount corresponding to the product of the current bypassed by the circuit 40A and the voltage division resistance of the resistance of the ATT 50A and the resistance of the resistor 21.

When the current bypassed by the current bypass circuit 40A is, e.g., zero, the voltage on the terminal 28 is determined solely by the reference voltage 31 applied to the input of the COM 30. The LPF circuit 60 filters out noise components contained in the bias voltage to be applied to the APD 70. Further, when the current input to the APD 70 increases, the LPF circuit 60 prevents the voltage on the terminal 65 from increasing.

With the above configuration, the illustrative embodiment does not need the addition 43 shown in FIG. 5 and therefore further scales down the circuitry. To set an output voltage and to effect temperature compensation for the APD 70, a current is pulled into the current bypass circuit 40A from the terminal 28. This excludes adjustment errors ascribable to, e.g., offsets apt to occur in the COM 30 and addition 43, FIG. 5, and thereby enhances accurate adjustment. The voltage variation 20B shown in FIG. 7 may be replaced with the voltage variation 20A shown in FIG. 4, if desired.

Figure 7:
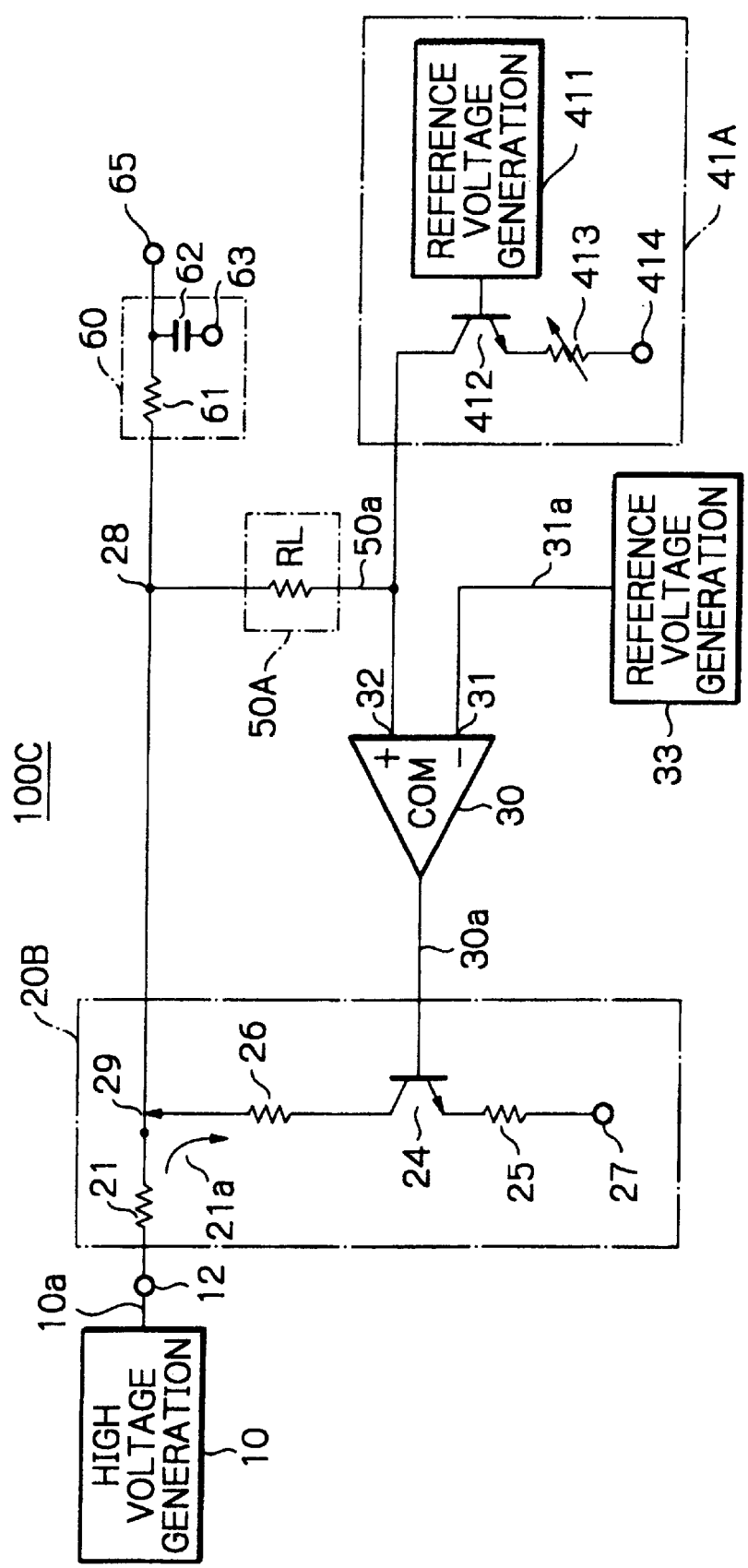
FIG. 7 is a block diagram schematically showing a specific configuration of an output voltage setting circuit included in the embodiment shown in FIG. 6.

FIG. 7 shows a specific configuration of the output voltage setting 41A included in the bias voltage control circuitry 100C of FIG. 6. As shown, the output voltage setting 41A includes a transistor 412. The output voltage setting 41A pulls in a current and applies it to the collector of the transistor 412 in order to bypass a current input to the input 32 of the COM 30 via the attenuator 50A. A reference voltage generation 411 applies its output voltage to the base of the transistor 412 for causing the transistor 412 to operate. A variable resistor 413 is connected to the emitter of the transistor 412 at one end and connected to a minimum potential terminal 414 at the other end.

In the illustrative embodiment, the current to be bypassed by the output voltage setting 41A is set by the variable resistor 413. The variable resistor 413 operates such that the voltage on the terminal 28 rises by an amount corresponding to a voltage drop derived from the product of the collector resistance of the current bypass transistor 412 and the bypass current. The above collector resistance of the transistor 412 refers to the voltage division resistance of the resistance RL of the attenuator 50A and the resistor 21. As for the rest of the operation including temperature compensation, this embodiment is identical with the embodiment shown in FIG. 6.

The output voltage setting 41A shown in FIG. 7 is extremely simple in circuit arrangement and includes a minimum of parts, so that the entire circuitry 100C is miniature and feasible for integration. The voltage variation 20B may also be replaced with the voltage variation 20A shown in FIG. 4, if desired.

Figure 8:
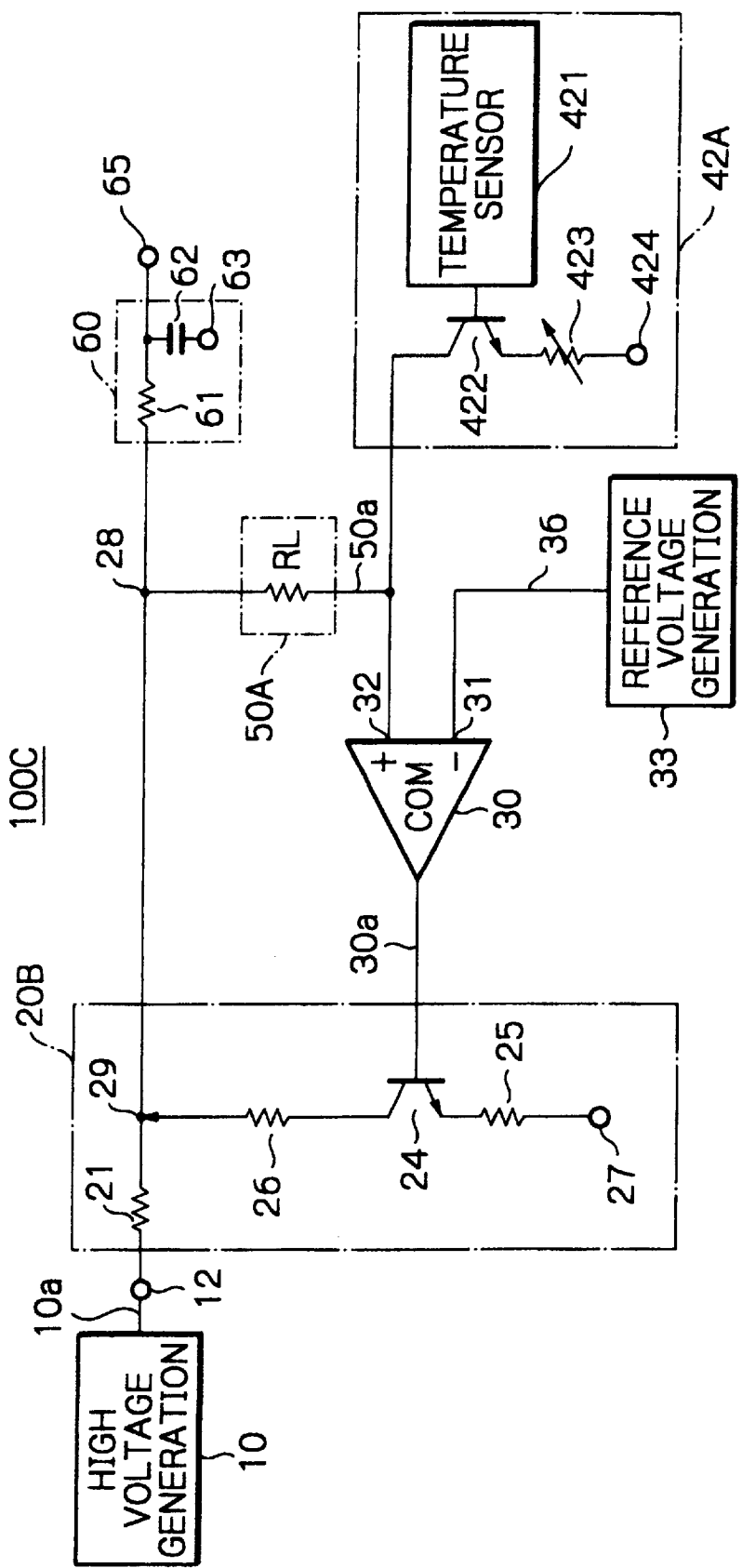
FIG. 8 is a block diagram schematically showing a specific configuration of a temperature compensating circuit also included in the embodiment shown in FIG. 6.

FIG. 8 shows a specific configuration of the temperature compensation 42A included in the bias voltage control circuitry 100C of FIG. 6. As shown, the temperature compensation 42A includes a transistor 422 and pulls in a current corresponding to the temperature slope of the breakdown voltage of the APD 70, not shown, by bypassing it from the input 32 of the COM 30. This current is applied to the collector of the transistor 422. A temperature sensor 421 is connected to the base of the transistor 422. A variable resistor 423 is connected to the emitter of the transistor 422 at one end and connected to a minimum voltage terminal 424 at the other end.

The variable resistor 423 varies the current bypassed by the temperature compensation 42A such that the voltage on the terminal 28 rises by an amount corresponding to a voltage drop derived from the product of the collector resistance of the transistor 422 and the bypass current. The above collector resistance of the transistor 422 refers to the voltage division resistance of the resistance RL of the attenuator 50A and resistor 21.

The temperature sensor 421 outputs a voltage representative of the ambient temperature and feeds it to the base of the transistor 422. The temperature sensor 421 is a device whose output voltage has any suitable temperature coefficient. Assume that the collector resistance of the transistor 422 and the emitter resistance of the transistor 422 are equal; the emitter resistance is the the sum of the variable resistor 423, a differential resistance representative of a change in the resistance of the junction between the emitter and the base of the transistor 422 ascribable to a change in temperature, and the emitter resistance of the transistor 422. That is, assume that the gain of the amplifier circuit made up of the transistor 422, collector resistance and emitter resistance is zero. Then, the temperature coefficient of a voltage output from the temperature sensor 421 directly appears as the temperature coefficient of the terminal 28.

On the other hand, when the above amplifier circuit has a positive gain, the temperature coefficient of the output voltage of the temperature sensor 421 is multiplied by the positive gain and then appears as the temperature coefficient of the terminal 28. Further, when the amplifier circuit has a negative gain, the temperature coefficient of the output voltage of the temperature sensor 421 is multiplied by the negative gain and then appears as the temperature coefficient of the terminal 28.

As stated above, in the specific configuration of FIG. 8, the transistor 422 is operated by the output voltage of the temperature sensor 421 representative of the ambient temperature so as to control the bypass current, thereby setting of the temperature slope of the APD 70. The temperature compensation 42A is therefore extremely simple in circuit arrangement and reduces the scale of the entire circuitry 100C. The voltage variation 20B may be replaced with the voltage variation 20A shown in FIG. 4, if desired.

Figure 9:
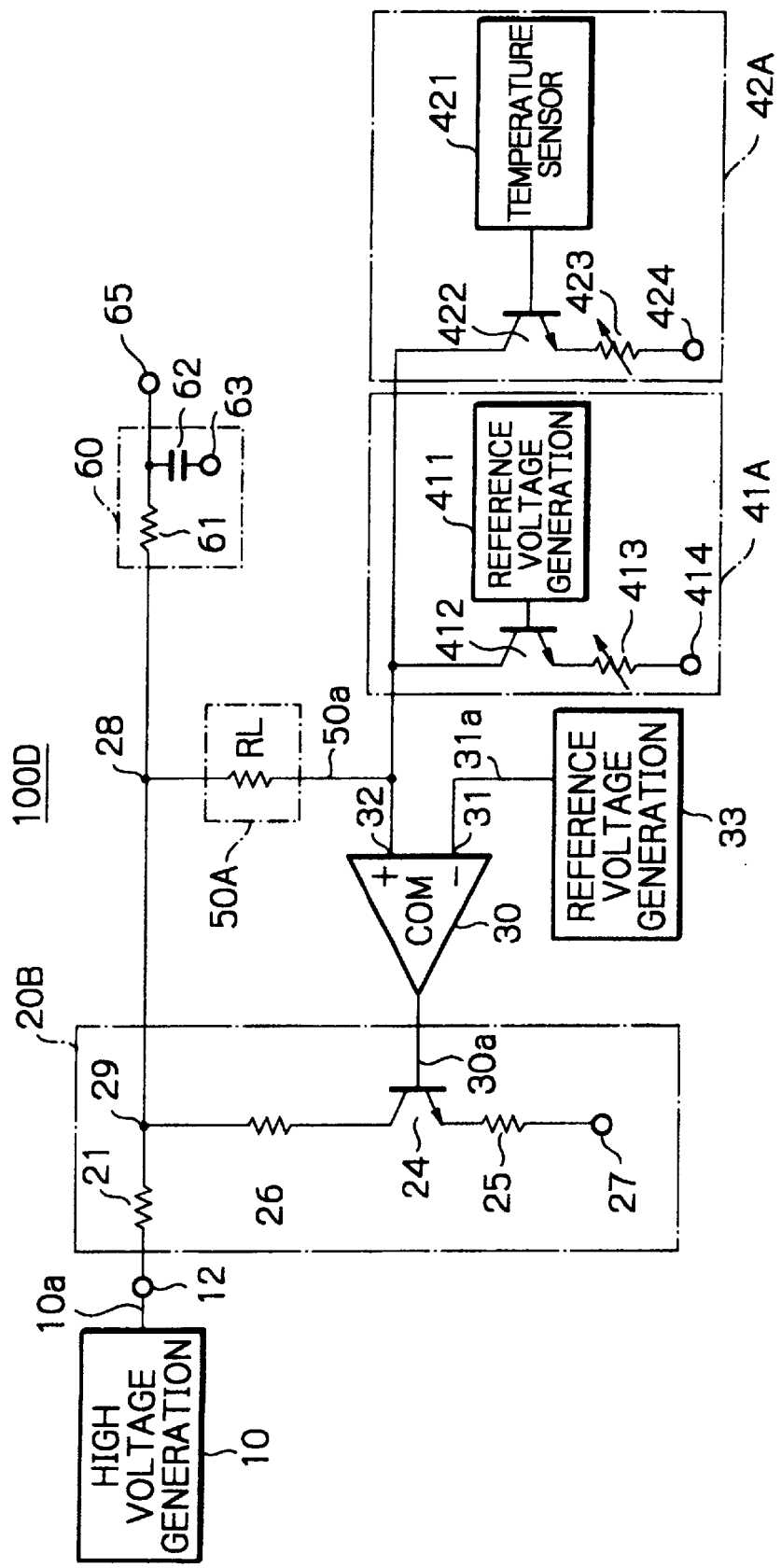
FIG. 9 is a block diagram schematically showing a further alternative embodiment of the present invention including the output voltage setting circuit of FIG. 7 and the temperature compensating circuit of FIG. 8.

Referring to FIG. 9, a further alternative embodiment of the present invention will be described. As shown, bias voltage control circuitry, generally 100D, includes the output voltage setting 41A of FIG. 7 and the temperature compensation 42A of FIG. 8. The DC voltage output from the high voltage generation 10 is input to the resistor 21 while the reference voltage 31a is applied to one input 31 of the COM 30. In response, the output voltage setting 41A pulls in a current for setting the optimal multiplication ratio for the APD 70 by bypassing it from the other input 32 of the COM 30. The COM 30 compares the output voltage 50a of the attenuator 50A applied to its input 32 with the reference voltage 31a and varies the output voltage on the terminal 28 in such a manner as to equalize the voltages on the inputs 31 and 32.

The current bypass transistor 24 and resistors 25 and 26 bypass a current under the control of the voltage control signal 30a. The output voltage on the terminal 29 is stabilized by a voltage drop derived from the product of the current bypassed by the transistor 24 and the resistor 21. The output voltage setting 41A bypasses a current corresponding to a set voltage implementing the optimal amplification ratio of the APD 70 from the input 32 of the COM 30. However, because the voltages on the terminals 31 and 32 are constantly equalized by the voltage control signal 30a output from the COM 30, the current to be bypassed by the output voltage setting 41A is determined by the variable resistor 413. Consequently, the voltage on the terminals 29 and 28 is raised by an amount corresponding to a voltage drop derived from the resistance of the collector of the transistor 412, i.e., the product of the voltage division resistance of the resistance RL of the attenuator 50A and resistor 21 and the bypass current. For example, when the current bypassed by the current bypass circuit 41A is zero, the voltage on the terminal 28 is determined solely by the reference voltage 31a applied to the COM 30.

The temperature compensation 42A operates to bypass a current corresponding to the temperature slope of the breakdown voltage of the APD 70 from the input 32 of the COM 30. However, because the voltages on the inputs 31 and 32 are constantly equalized, the current to be bypassed by the temperature compensation 42A is varied by the variable resistor 423. As a result, the voltage on the terminal 28 is raised by an amount corresponding to the voltage drop derived from the product of the collector resistance of the transistor 422, i.e., the voltage division resistance of the resistance RL of the attenuator 50A and resistor 21 and the bypass current.

The temperature sensor 421 is a device whose output voltage has any desired temperature coefficient, as stated earlier. Assume that the collector resistance of the transistor 422 and the resistance of the emitter of the transistor 422, i.e., the sum of the variable resistor 423, differential resistance and the emitter resistance of the transistor 422 are equal. That is, assume that the gain of the amplifier circuit made up of the transistor 422, collector resistance and emitter resistance is zero. Then, the temperature coefficient of a voltage output from the temperature sensor 421 directly appears as the temperature coefficient of the terminal 28. On the other hand, when the above amplifier circuit has a positive gain, the temperature coefficient of the output voltage of the temperature sensor 421 is multiplied by the positive gain and then appears as the temperature coefficient of the terminal 28. Further, when the amplifier circuit has a negative gain, the temperature coefficient of the output voltage of the temperature sensor 421 is multiplied by the negative gain and then appears as the temperature coefficient of the terminal 28.

With the above construction and operation, the circuitry 100D sets an output voltage and executes temperature compensation for the APD 70 by bypassing a current flowing from the terminal 28. This kind of scheme is capable of obviating adjustment errors ascribable to offsets apt to occur in a voltage comparator and an addition circuit, compared to the scheme manipulating a reference voltage input to a voltage comparator. That is, the circuitry 100D enhances accurate adjustment and has a miniature, power saving configuration. The voltage variation 20B may be replaced with the voltage variation 20A shown in FIG. 4, if desired.

Figure 10:
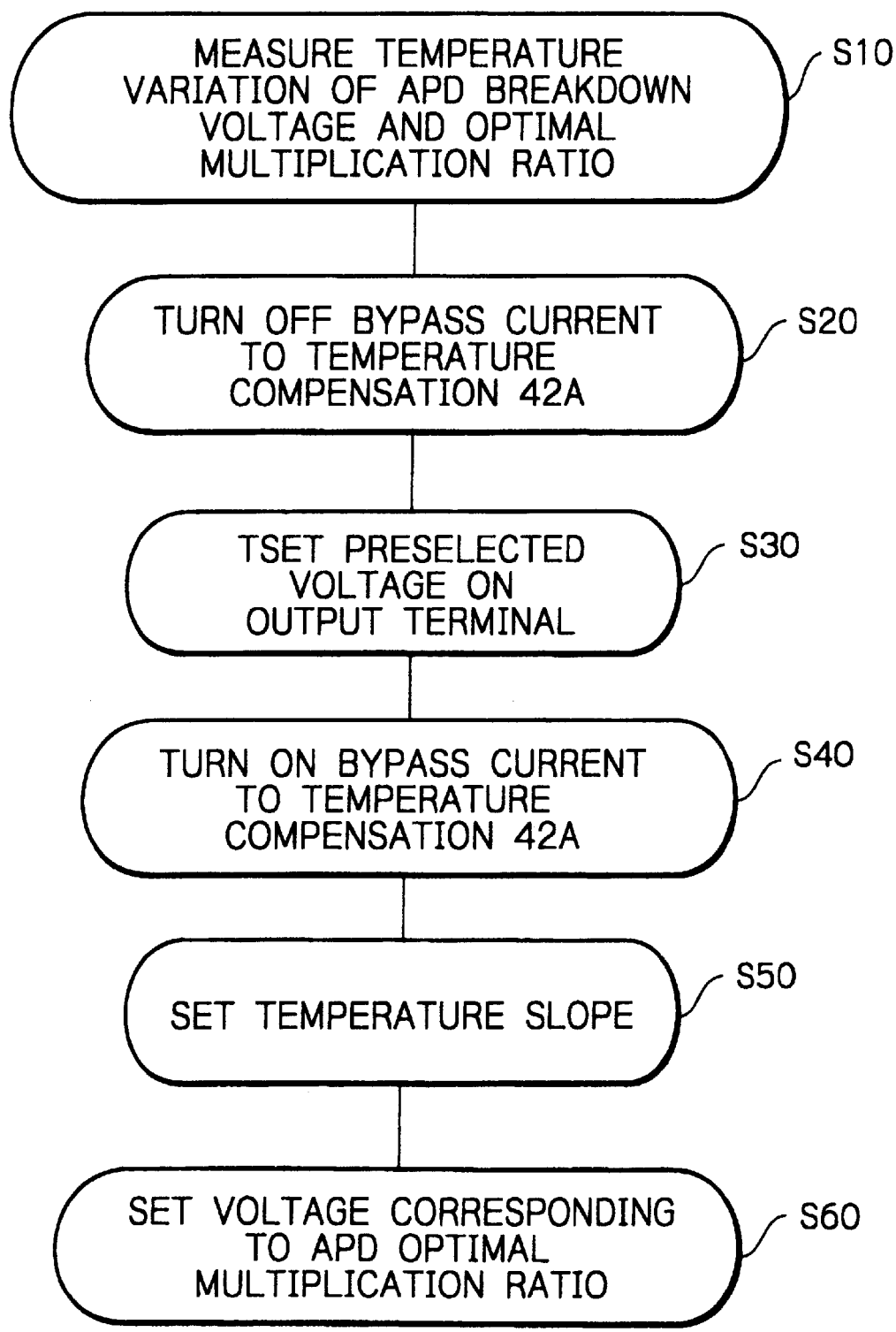
FIG. 10 is a flowchart demonstrating a specific procedure for adjusting the circuitry shown in FIG. 9.

FIG. 10 demonstrates a specific procedure for adjusting the bias voltage control circuitry 100D shown in FIG. 9. As shown, at the beginning, the temperature slope of the breakdown voltage and optimal multiplication ratio of the APD 70 are measured (step S10). Then, the bypass current to flow into the temperature compensation 42A is turned off, i.e., reduced to zero (step S20). Subsequently, the voltage on the terminal 28 is controlled to a preselected value by the variable resistor 413 (step S30). Thereafter, the bypass current to flow into the temperature compensation 42A is turned on (step S40). Then, the temperature slope of the breakdown voltage of the APD 70 measured in the step S10 is applied to the voltage on the terminal 28 by the variable resistor 423 (setting of a temperature slope) (step S50). Finally, the set voltage on the terminal 65 is replaced with a voltage corresponding to the optimal multiplication ratio of the APD 70 by the variable resistor 413 (step S60).

Figure 11:
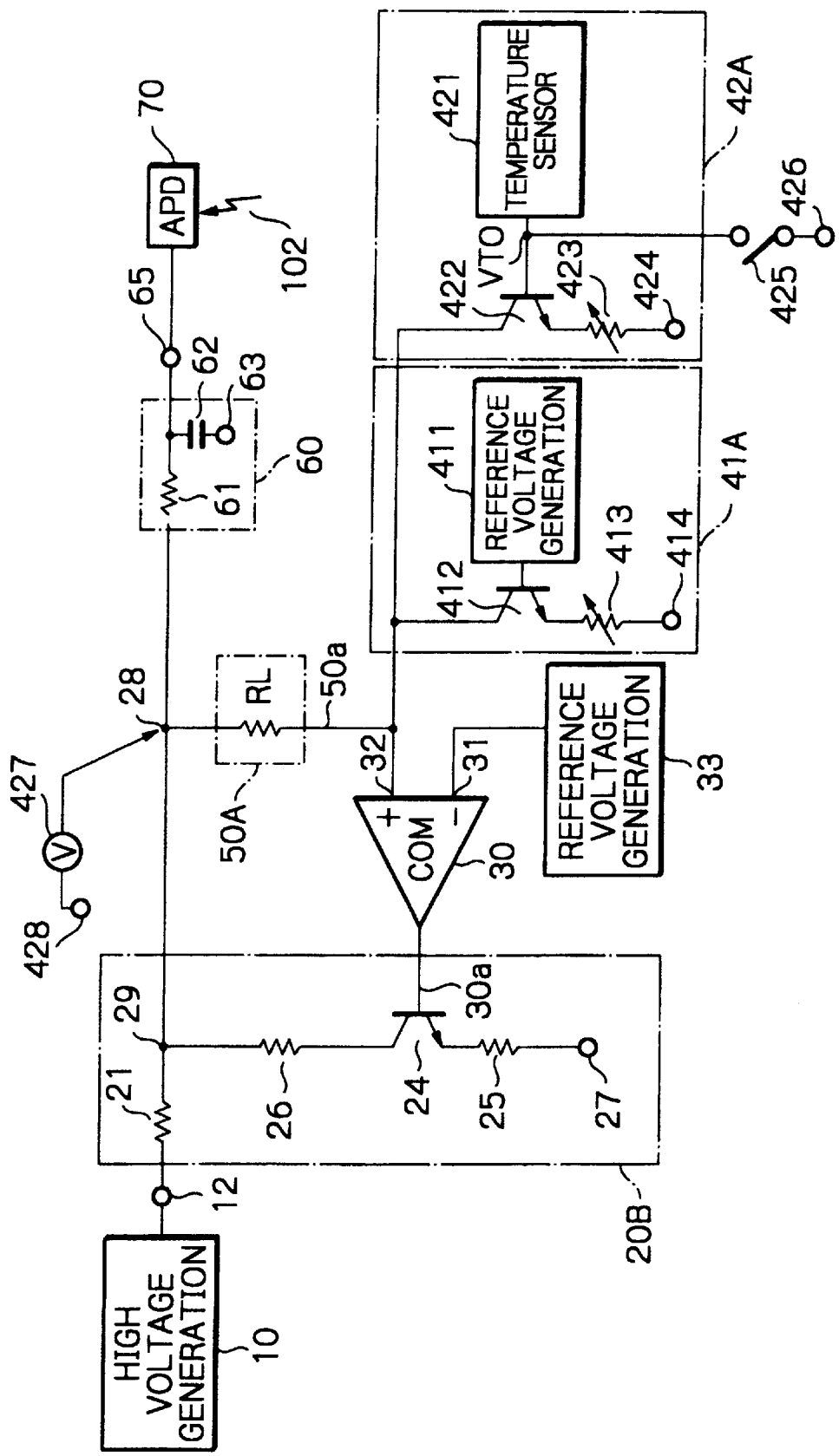
FIG. 11 is a schematic block diagram showing an arrangement for executing the procedure of FIG. 10.

FIG. 11 shows an arrangement for executing the adjustment procedure of FIG. 10. In the step S10, FIG. 10, the temperature slope and optimal multiplication ratio of the APD 70 are measured, as stated previously. As for the temperature slope, a voltage corresponding to a temperature slope ascribable temperature variation may be determined by measuring breakdown voltages at some different ambient temperatures.

A method of measuring the above optimal multiplication ratio will be described with reference to FIG. 1. A DC voltage is applied to the APD or subject 70 via the terminal 65. Also, an optical signal 102 is input to the APD 70. A current induced in the APD 70 is transformed to a voltage and amplified by the current/voltage conversion and amplification 80. The resulting output of the conversion and amplification 80, i.e., the detected voltage signal 80a is input to a bit error rate measuring apparatus, not shown.

Subsequently, a voltage several volts lower than the breakdown voltage is applied to the APD 70. Then, the optical signal 102 is reduced in order to set up a first preselected bit error rate. In this condition, the voltage being applied to the APD 70 is varied little by little in order to measure a voltage optimizing the bit error rate and a bit error rate of that instant. The relation between the voltage and the bit error rate is plotted with the former and the latter assigned to the abscissa and ordinate, respectively. Thereafter, the level of the optical signal is further reduced in order to set up a second preselected bit error rate. The voltage being applied to the APD 70 is again varied little by little in order to measure a voltage optimizing the bit error rate and a bit error rate of that instant; the voltage and bit error rate are plotted in a graph. Such measurement is repeated thereafter. Finally, a voltage optimized the preselected bit error rate is determined to be a bias voltage implementing the optimal multiplication ratio.

Referring again to FIG. 11, to cause the output voltage setting 41A to output a voltage alone, the bypass current to flow into the temperature compensation 42A is reduced to zero (step S20, FIG. 10). This may advantageously be done by short-circuiting the base potential of the transistor 422 to the minimum potential 426 via the switch 425. A voltage set on the terminal 28 at this time is assumed to be HV1.

The output voltage setting 41A bypasses a current corresponding to a set voltage implementing the optimal amplification ratio of the APD 70 from the input 32 of the COM 30. However, because the voltages on the terminals 31 and 32 are constantly equalized by the voltage control signal 30a output from the COM 30, the current to be bypassed by the output voltage setting 41A is determined by the variable resistor 413. Consequently, the voltage on the terminals 29 and 28 is raised by an amount corresponding to a voltage drop derived from the collector resistance of the transistor 412, i.e., the product of the voltage division resistance of the resistance RL of the attenuator 50A and resistor 21 and the bypass current, as stated earlier.

The bypass current to flow into the temperature compensation 42A is turned on (step S40, FIG. 10). For this purpose, the base potential of the transistor 422 having been short-circuited to the minimum potential terminal 424 is opened. Subsequently, the temperature slope of the breakdown voltage of the APD 70 measured beforehand is applied to the voltage on the terminal 28 by the variable resistor 423 (step S50, FIG. 10). The temperature compensation 42A is constantly controlled by the voltage control signal 30a in such a manner as to equalize the current corresponding to the above temperature slope to a constant voltage. Therefore, the current to be bypassed by the temperature compensation is varied by the variable resistor 423. As a result, the voltage on the terminal 28 is raised by an amount corresponding to the voltage drop derived from the product of the collector resistance of the transistor 422 and the bypass current.

The temperature sensor 421 should only be implemented by a device having a temperature coefficient in its output voltage. It follows that when the collector resistance and emitter resistance of the transistor 42 are equal, i.e., when the gain of the amplifier circuit constituted by the collector resistance of the transistor 422 and variable resistor 423 is zero, the temperature coefficient of the output voltage of the temperature sensor 421 directly appears as a temperature coefficient for the voltage of the terminal 28. On the other hand, when the above amplifier circuit has a significant gain, the temperature coefficient of the output voltage of the temperature sensor 312 is amplified by the gain and then output as a temperature coefficient for the voltage of the terminal 28.

More specifically, assume that the temperature sensor 421 outputs a voltage of VT0, and that the temperature slope of the output voltage is A (mV/°C.). Then, when the gain of the amplifying circuit constituted by the collector resistance of the transistor 422 and variable resistor 423 is zero, a voltage of HV1+VT0 appears on the terminal 28 while the temperature coefficient is A (mV/°C.). When the above gain is doubled, a voltage of HV1+2VT0 appears on the terminal 28 while the temperature coefficient is 2 A (mV/°C.). Likewise, when the gain is halved, a voltage of HV1+VT0/2 appears on the terminal 28 while the temperature coefficient is A/2 (mV/°C.).

The temperature slope B (mV/°C.) of the breakdown voltage of the APD 70 has already been measured. Therefore, characteristic of the voltage on the terminal 28 can be provided with a temperature slope if a voltage appearing on the terminal 28 is measured by a voltmeter 427 connected to the minimum potential terminal 428 and if the variable resistor 423 is controlled to set up a voltage of HV1+(B/A)×VT0. Finally, the variable resistor 413 is controlled such that the voltage set on the terminal 65 coincides with the voltage implementing the optimal multiplication ratio of the APD 70 and measured beforehand (step S60, FIG. 10).

By the above adjustment procedure, it is possible to set the optimal multiplication ratio and to adjust the setting for temperature compensation with accuracy high enough to obviate errors. In the illustrative embodiment, the variable resistor 413 of the output voltage setting 41A is varied to control the bypass current and therefore the voltage on the terminal 28. Alternatively, the voltage to be applied to the base of the transistor 412 may be varied, in which case the variable resistor 413 will be replaced with a fixed resistance. While the COM 30 is shown in its simplified form, a band limiting element should, in practice, preferably be included in the control loop.

In summary, it will be seen that the present invention provides bias voltage control circuitry capable of constantly setting a bias voltage implementing the optimal amplification ratio of an APD with accuracy. Further, the circuitry is not susceptible to the fluctuation of a power source voltage. In addition, the circuitry can effect temperature compensation at the same time because it sets the temperature slope of the breakdown voltage of the APD also.

The entire disclosure of Japanese patent application No. 14728/1998 filed on Jan. 12, 1998 including the specification, claims, accompanying drawings and abstract of the disclosure is incorporated herein by reference in its entirety.

While the present invention has been described with reference to the particular illustrative embodiments, it is not to be restricted by those embodiments. It is to be appreciated that those skilled in the art can change or modify the embodiments without departing from the scope and spirit of the present invention.

What is claimed is:

1. Bias voltage control circuitry for an avalanche photo-diode (APD), comprising:
   a voltage varying circuit for controlling an input DC voltage in accordance with a voltage control signal to thereby output a varied voltage, said varied voltage being controlled and then output via an output terminal of said bias voltage control circuitry as a bias voltage to be applied to the APD;
   a temperature slope voltage outputting circuit for outputting a voltage corresponding to a temperature slope of a breakdown voltage of an opposite direction particular to the APD;

a set voltage outputting circuit for outputting a set voltage for controlling a voltage of said output terminal to a preselected value; and a comparing and control circuit for setting a reference voltage based on said voltage corresponding to the temperature slope and said set voltage, generating said voltage control signal such that said reference voltage and a voltage input from said output terminal via a resistor coincide with each other, and feeding said voltage control signal to said voltage varying circuit;

said voltage varying circuit comprising a digital variable resistor whose resistance is variable in accordance with a digital voltage control signal, said digital variable resistor outputting said digital voltage control signal by digitizing said voltage control signal and feeding said digital voltage control signal to said digital variable resistor, whereby a resistance of said digital variable resistor is set to control said input DC voltage.

2. Circuitry in accordance with claim 1, wherein said comparing and control circuit comprises a voltage comparator for comparing said reference voltage and the voltage set on said output terminal.

3. Circuitry in accordance with claim 1, further comprising a low-pass filter circuit connected to said output terminal for filtering out a high frequency component contained in the voltage set on said output terminal to thereby output a voltage containing only a low frequency component, said voltage output from said low-pass filter circuit being applied as the bias voltage for the APD.

4. Bias voltage control circuitry for an APD, comprising:

a voltage varying circuit for controlling an input DC voltage in accordance with a voltage control signal applied to an input terminal to thereby output a varied voltage, said varied voltage being controlled and then output via an output terminal of said bias voltage control circuitry as a bias voltage to be applied to the APD;

a temperature slope voltage outputting circuit for outputting a voltage corresponding to a temperature slope of a breakdown voltage of an opposite direction particular to the APD;

a set voltage outputting circuit for outputting a set voltage for controlling a voltage of said output terminal to a preselected value; and a comparing and control circuit for setting a reference voltage based on said voltage corresponding to the temperature slope and said set voltage, generating said voltage control signal such that said reference voltage and a voltage input from said output terminal via an attenuating resistor coincide with each other, and feeding said voltage control signal to said voltage varying circuit;

said voltage varying circuit comprising a current control section made up of a first resistor serially connected to said input terminal, a second resistor serially connected to said first resistor, and a transistor connected to said second resistor for controlling a current to flow through said first resistor and said second resistor in accordance with said voltage control signal, wherein the voltage to be applied to said output terminal appears at a junction between said first resistor and said second resistor.

5. Bias voltage control circuitry for an APD, comprising:

a voltage varying circuit for controlling an input DC voltage in accordance with a voltage control signal applied to an input terminal to thereby output a varied voltage, said varied voltage being controlled and then output via an output terminal of said bias voltage control circuitry as a bias voltage to be applied to the APD;

an output voltage setting circuit for pulling in a current from said output terminal via a first resistor to thereby set a preselected voltage on said output terminal;

a current pulling circuit for pulling in the current from said output terminal via said first resistor to thereby pull in a current corresponding to a temperature slope of a breakdown voltage of an opposite direction particular to the APD; and a comparing and control circuit for setting a preselected reference voltage, generating said voltage control signal such that said reference voltage and the voltage input from said output terminal via said first resistor coincide with each other, and applying said voltage control signal to said voltage varying circuit.

6. Circuitry in accordance with claim 5, wherein said output voltage setting circuit comprises:

a first transistor connected to said first resistor for controlling the current to be pulled in; and a first variable resistor connected to said first transistor for adjusting the current to be pulled in;

said output voltage setting circuit applying a preselected voltage to said first transistor to cause said first transistor to operate, adjusting a resistance of said first variable resistor to thereby control the current to be pulled in, and thereby controlling the voltage on said output terminal to the preselected value.

7. Circuitry in accordance with claim 5, wherein said current pulling circuit comprises:

a temperature sensor for sensing an ambient temperature to thereby output a signal representative of the ambient temperature;

a second transistor connected to said first resistor for controlling the current to be pulled in; and a second variable resistor connected to said second transistor for adjusting the current to be pulled in;

said current pulling circuit applying said signal output from said temperature sensor to said second transistor to causes said second transistor to operate, and adjusting a resistance of said second variable resistor to thereby control the current to be pulled in.

8. Circuitry in accordance with claim 5, wherein said voltage varying circuit comprises a current control section having a second resistor serially connected to said input terminal, a third resistor serially connected to said second resistor, and a third transistor connected to said third resistor for controlling the current in accordance with said voltage control signal; and wherein said third transistor controls the current to flow through said second resistor and said third resistor, the voltage to be applied to said output terminal appearing at a junction between said second resistor and said third resistor.

9. Circuitry in accordance with claim 5, wherein said voltage varying circuit comprises a digital variable resistor capable of digitally varying a resistance thereof in accordance with a digital voltage control signal, said voltage varying circuit converting said voltage control signal to said digital voltage control signal, setting a resistance of said digital variable resistor with said digital voltage control signal, and thereby controlling the input DC voltage.

10. Circuitry in accordance with claim 5, wherein said comparing and control circuit comprises a voltage comparator for comparing said reference voltage and a voltage input from said output terminal via said first resistor.

11. A method of executing adjustment of temperature compensation and adjustment to an optimal multiplication ratio for bias voltage control circuitry for an APD, said bias voltage control circuitry comprising:

a voltage varying circuit for controlling an input DC voltage in accordance with a voltage control signal applied to an input terminal to thereby output a varied voltage, said varied voltage being controlled and then output via an output terminal of said bias voltage control circuitry as a bias voltage to be applied to the APD;

an output voltage setting circuit for pulling in a current from said output terminal via a first resistor to thereby set a preselected voltage on said output terminal;

a current pulling circuit for pulling in the current from said output terminal via said first resistor to thereby pull in a current corresponding to a temperature slope of a breakdown voltage of an opposite direction particular to the APD; and a comparing and control circuit for setting a preselected reference voltage, generating said voltage control signal such that said reference voltage and the voltage input from said output terminal via said first resistor coincide with each other, and applying said voltage control signal to said voltage varying circuit;

said method comprising the steps of:
(a) measuring the temperature slope of the breakdown voltage of the opposite direction and an optimal multiplication ratio particular to the APD to be used;
(b) connecting the APD to said output terminal and applying a preselected DC voltage to said input terminal;
(c) interrupting pulling of the current into said current pulling circuit, and then causing said output voltage setting circuit to control the voltage on said output terminal to a preselected value;
(d) resuming the pulling of the current into said current pulling circuit to thereby pull in a current corresponding to the temperature slope; and
(e) causing said output voltage setting circuit to adjust the voltage on said output terminal to the optimal multiplication ratio.

12. A method in accordance with claim 11, wherein said output voltage setting circuit comprises a first transistor connected to said first resistor for controlling the current to be pulled in, and a first variable resistor connected to said first transistor for adjusting the current to be pulled in;

step (c) comprising (f) adjusting a resistance of said first variable resistor to thereby control the current to be pulled in, and thereby controlling the voltage on said output voltage to the preselected value.

13. A method in accordance with claim 11, wherein said current pulling circuit comprises a temperature sensor for sensing an ambient temperature to thereby output a signal representative of the ambient temperature;

a second transistor connected to said first resistor for controlling the current to be pulled in, said voltage control signal being applied to said second transistor; and a second variable resistor connected to said second transistor for adjusting the current to be pulled in;

step (d) comprising (g) controlling a resistance of said second variable resistor to thereby control the current to be pulled in.

14. A method in accordance with claim 11, wherein said voltage varying circuit comprises a current control section having a second resistor serially connected to said input terminal, a third resistor serially connected to said second resistor, and a third transistor connected to said third resistor for controlling the current in accordance with said voltage control signal;

said method further comprising the step of (h) causing said third transistor to control, in accordance with said voltage control signal, a current flowing through said second resistor and said third resistor, and producing the voltage to be applied to said output terminal via a junction between said second resistor and said third resistor.

15. A method in accordance with claim 11, wherein said voltage varying circuit comprises a digital variable resistor capable of digitally varying a resistance thereof in accordance with a digital voltage control signal;

said method further comprising the step of (i) causing said voltage varying circuit to covert said voltage control signal to said digital voltage control signal, setting a resistance of said digital variable resistor with said digital voltage control signal, and thereby controlling the input DC voltage.

* * * * *